United States Patent [19]

Mottahed

[11] Patent Number: 5,557,063
[45] Date of Patent: Sep. 17, 1996

[54] ELECTRONIC COMPONENT ENCLOSURE FOR RF SHIELDING

[75] Inventor: Behzad D. Mottahed, Upper Montclair, N.J.

[73] Assignee: Lucent Technologies Inc., Murray Hill, N.J.

[21] Appl. No.: 176,637

[22] Filed: Jan. 3, 1994

[51] Int. Cl.⁶ .................................................. H05K 9/00
[52] U.S. Cl. ................................ 174/35 GC; 361/816
[58] Field of Search ........................... 174/35 R, 35 C, 174/35 GC, 35 MS; 361/800, 816, 818

[56] References Cited

U.S. PATENT DOCUMENTS

| | | | |
|---|---|---|---|
| 2,379,322 | 6/1945 | Tierney, Jr. .................... | 315/85 |
| 3,296,356 | 1/1967 | McAdams ..................... | 174/35 GC |
| 3,304,360 | 2/1967 | Hadley et al. ................. | 174/35 GC |
| 4,688,148 | 8/1987 | Mallory et al. ................ | 361/740 |
| 4,831,498 | 5/1989 | Baba ............................. | 174/35 GC X |
| 5,170,009 | 12/1992 | Kadokura ...................... | 174/35 R |
| 5,398,156 | 3/1995 | Steffes et al. ................. | 29/831 X |

Primary Examiner—Laura Thomas
Assistant Examiner—Christopher Horgan

[57] ABSTRACT

Improved RF shielding is disclosed. The shielding provides a joint seal that can eliminate the soldering, and the screws and gaskets, otherwise required for securing RF shield caps and walls to reduce EMI. Conductive shield caps that can be simply snap fit against the groundplane are also disclosed.

4 Claims, 4 Drawing Sheets

ELECTRONIC COMPONENT ENCLOSURE FOR RF SHIELDING

BACKGROUND OF THE INVENTION

1. Field of the Invention

The present invention pertains to component shielding. More specifically, the present invention pertains to the shielding of electrical components and circuits that radiate, or are sensitive to, electromagnetic interference (EMI).

2. Discussion of Related Art

Isolation of circuit components from sources of EMI is particularly important in communications equipment, such as cellular telephone units and related relay-station equipment, having components that operate in the 50 MHz to 4 GHz frequency range. The typical rf isolation shield for electronic components in such units cannot provide the substantial shielding they require, greater than 60 dBm, without pressure-fit conductive gaskets and a large number of screws, or soldering. More than one screw for each linear inch may be required at 1000 MHz to sufficiently ground and stably secure shield walls.

Alternatively, if the shield is formed as a cap, the cap may be attached and grounded by soldering. But soldering is also expensive, and it may be less reliable than gasket mounting after a cap is removed, because air gaps in the rf seal, caused by the roughness of the solder from which the cap was removed, may remain after the cap is reattached by soldering. Moreover, such caps may be difficult to unsolder and the unsoldering operation itself is risky, possibly causing heat damage to electronic components or delamination of portions of the assembly. Furthermore, even the gaskets tend to leak when they are reinstalled, because of mechnical damage to the thin gasket material or an improper placement of the gasket material during reassembly causing EMI leakage. A new gasket may be needed each time the shield is reassembled.

SUMMARY OF THE INVENTION

An electronic isolation shield in accordance with the present invention includes a sealing edge which contacts the surface of an electronic component assembly when the shield is mounted thereon. The sealing edge has a planar surface disposed so as to rest against a planar surface of the electronic assembly, and a longitudinal tongue that extends along the length of the wall. The longitudinal tongue is disposed to mate with grounding material on the surface of a corresponding groove on the surface of the electronic component assembly.

The present invention permits shielding effectiveness as high as 95 dBm at 1000 MHz to be obtained without gaskets and with far fewer screws, fewer than 1 for each three inches. Even in the event the groove in the grounding surface varies by ±0.005 inches (0.0127 cm.), the shielding loss is typically not more than 5–10 dBm. Because the tongue-and-groove shielding joint is so forgiving of surface variations, costs can be further reduced by eliminating screws entirely and snap-fitting an rf shielding cap onto the component assembly instead.

It has been estimated that, when the units are manufactured in production quantities, each screw eliminated from the shield saves $0.15. Elimination of the gasket saves another $2.00 in parts and assembly costs. On the other hand, the additional cost for routing and plating the groove surface is only $0.10; and molding the longitudinal tongue, merely another $0.10.

A snap-fit 2.3×1.5 inch (5.84×3.81 cm.) shield cap for a cellular telephone components costs $3.50 less than its conventional equivalent, because it can be merely pressed into place on the printed circuit board, without soldering, if it has this rf seal. Moreover, the removal and the reattachment of removed soldered caps is even more costly and difficult, as noted above.

BRIEF DESCRIPTION OF THE DRAWINGS

The features and advantages of the present invention will be better understood when the detailed description of a preferred embodiment given below is considered in conjunction with the drawings provided, wherein:

FIG. 3b is a plan view of the underside of the cap shown in FIG. 3a.

In these figures, like reference numerals indicate similar structures.

DETAILED DESCRIPTION OF A PREFERRED EMBODIMENT

Figure 1:
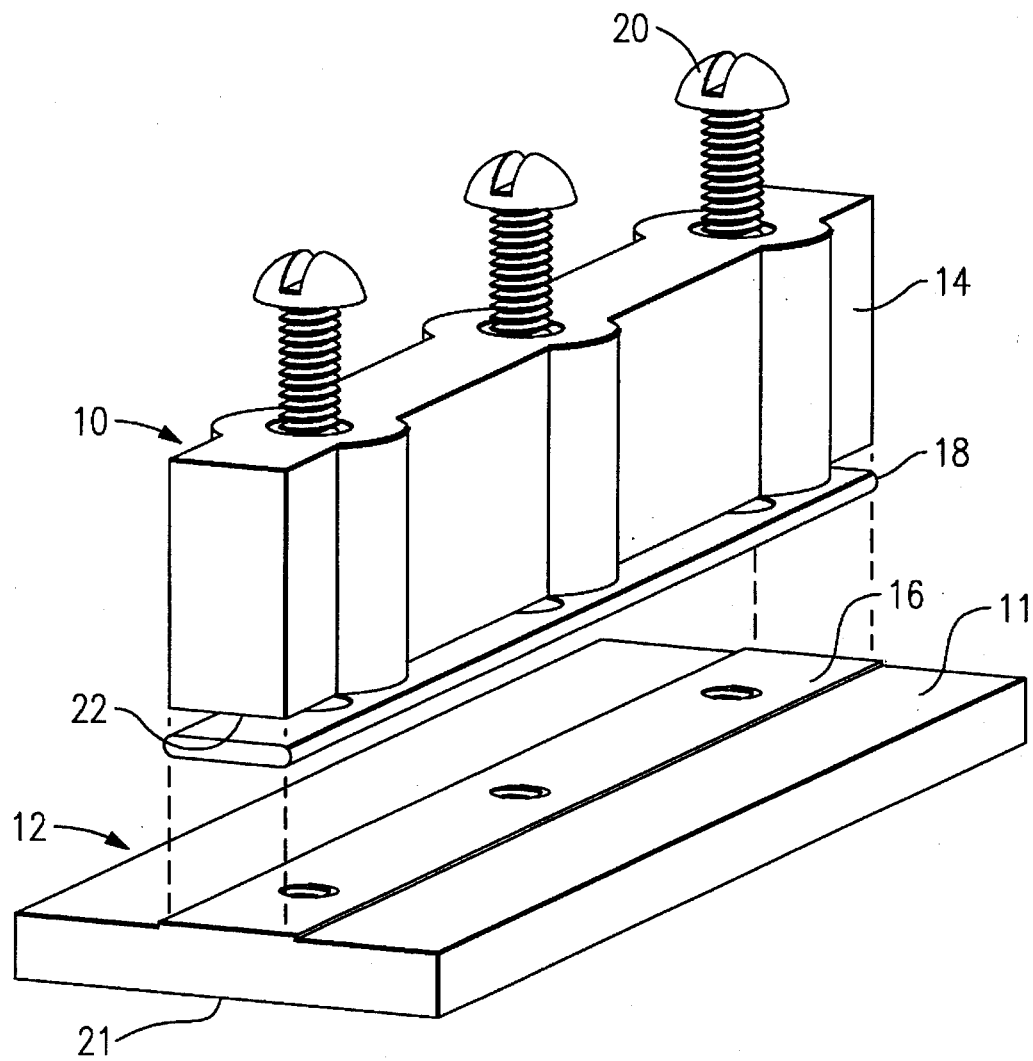
FIG. 1 is an exploded view of an rf shield attached to an electronic component assembly in accordance with the prior art.

FIG. 1 shows a conventional aluminum rf shield 10 attached to the component surface 11 of a 0.062-inch (0.1575-cm.) double-sided printed circuit board 12 made of conventional material, such as FR4, in accordance with the prior art. The walls 14 of the shield 10 are formed of cast aluminum having a thickness of 0.125 inches (0.3175 cm.). The wall 14 are mounted onto a typical 0.375-inch (0.9525-cm.) copper groundplane conductor strip 16, which crowds the component surface 11 of the board 12. Even so, substantial shielding, greater than 60 dBm, is not easily obtained without installing a conductive gasket 18 and a large number of screws 20 which are driven through the component suface 11 toward the opposite surface 21 of the board 12. Approximately one screw for each linear inch and a 0.02-inch (0.0508 cm.) thick specialized resilient conductive gasket 18 impregnated with metal particles are required between the flat mating edge 22 of each wall 14 and the conductor strip 16 on the component surface 11 of the board, to secure and ground the walls 14 to the groundplane of the board 12 at 1000 MHz.

Figure 2A:
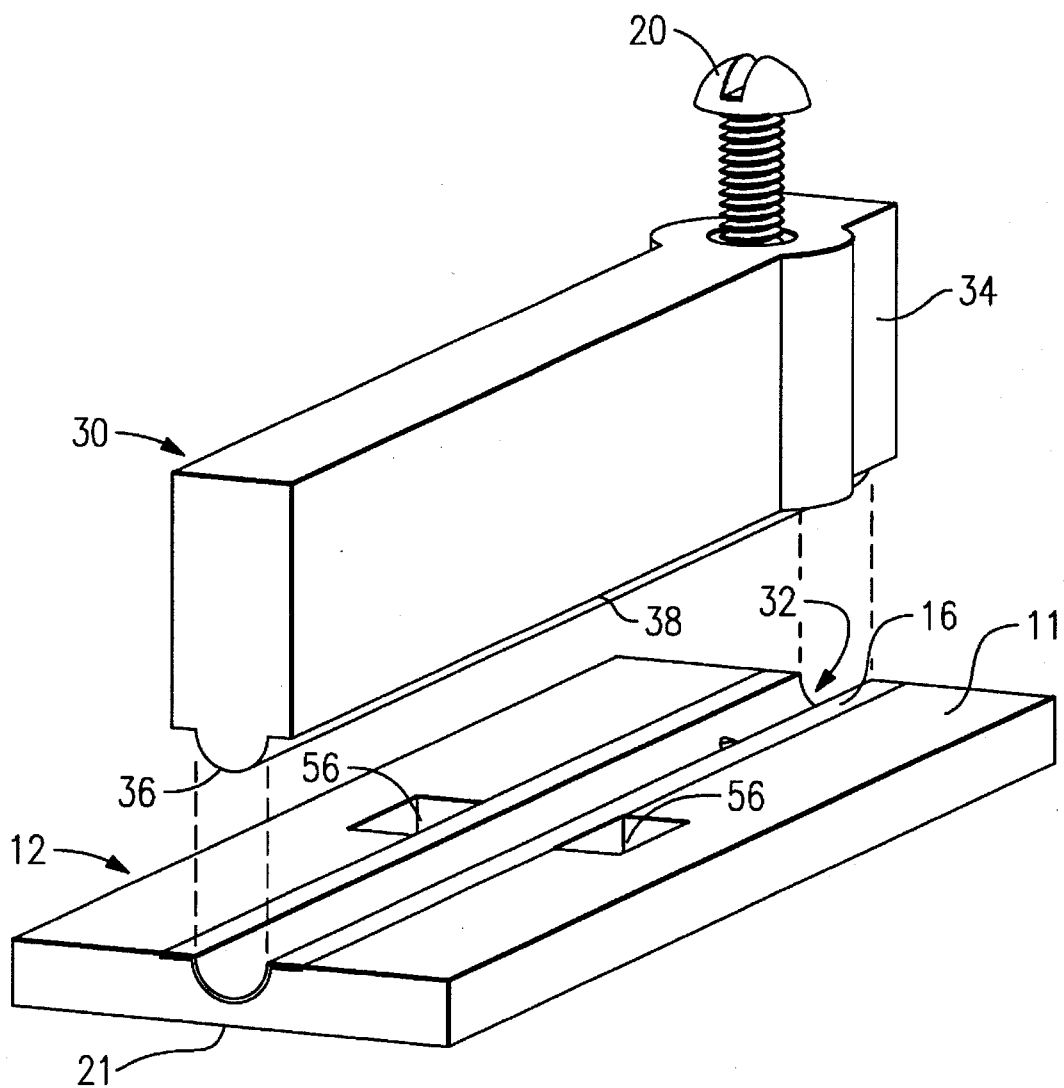
FIG. 2a is an exploded view of an rf shield attached to an electronic component assembly in accordance with the present invention.

FIG. 2a shows a shield 30 mounted on the circuit board 12. The holes 56 are shown in phantom in FIG. 2a and when utilized the screw 20 of FIG. 2a is not needed. A 0.085-inch (0.2159-cm.) wide semi-circular U-channel groove 32 is routed into the component surface 11 of this portion in a direction toward the opposite surface 21 of the circuit board 12. The ground plane conductor strip 16 is then plated over this routed groove in a conventional way. The conductor strip 16 may be the same width as strip 16 of FIG. 1 and centered from edge-to-edge, or limited to the width of the groove 32, extending from one edge of the groove's surface to the other. To maintain mechanical integrity, the depth of the groove 32 should not exceed 60% of the thickness of the board 12. The finished, plated groove is typically 0.035-inch (0.089-cm.) deep.

Figure 2B:
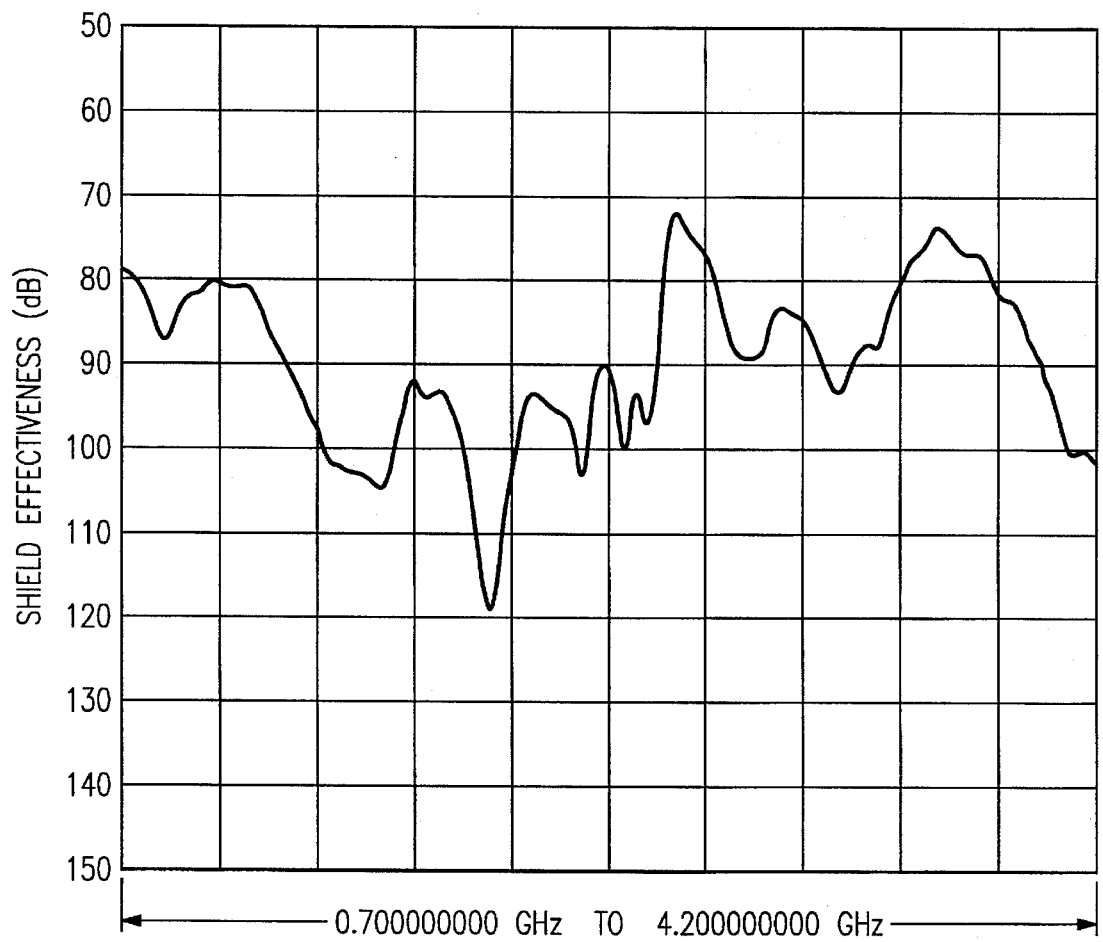
FIG. 2b is a test chart showing the shielding effectiveness of the tongue and groove design in dual chamber tests from 0.7 GHz to 4.2 GHz.

Molded aluminum walls 34 of the shield 30 typically have a 0.085-inch (0.2159-cm.) wide longitudinal, preferably semi-circular U-shaped tongue 36 formed in the center of the flat mating edge 38 of the walls 34. The tongue 36 typically projects downward, as viewed in FIG. 2(*a*) 0.035 inches (0.089 cm.) and extends substantially along the entire length of the walls 34, with gaps for the screws, such as screw 20 of FIG. 2(*a*). FIG. 2(*b*) shows a test chart of the highly-effective isolation having an X axis given in frequency and a Y axis illustrating the Shield Effectiveness and given in dB, provided by this combination of a conductive semi-circular tongue 36 and the mating surface on the walls of the plated groove 32 on the circuit board's 12 component surface. These results were obtained in dual-chamber rf testing across the frequency range of 0.7 GHz to 4.2 GHz. It is expected that a 0.005-inch (0.0127-cm.) variation, up or down, in the flat or curved mating surfaces on the board 12 or the shield 30 will not cause more than 5–10 dBm loss in shielding effectiveness.

Figure 3A:
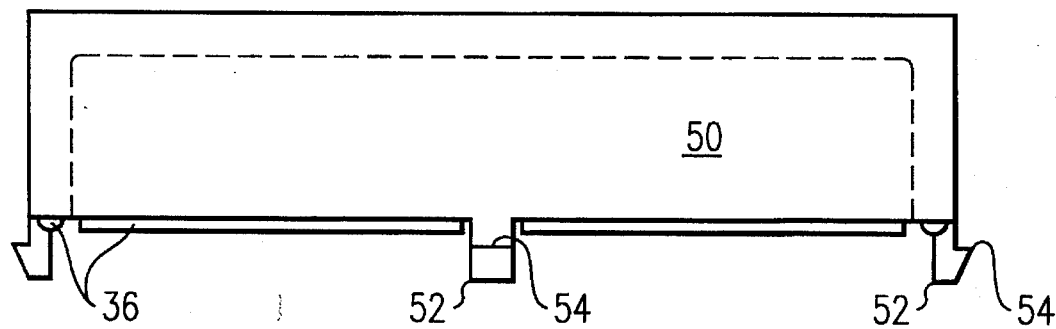
FIG. 3a is a side elevation of a snap-on rf shield cap in accordance with the present invention.
Figure 3B:
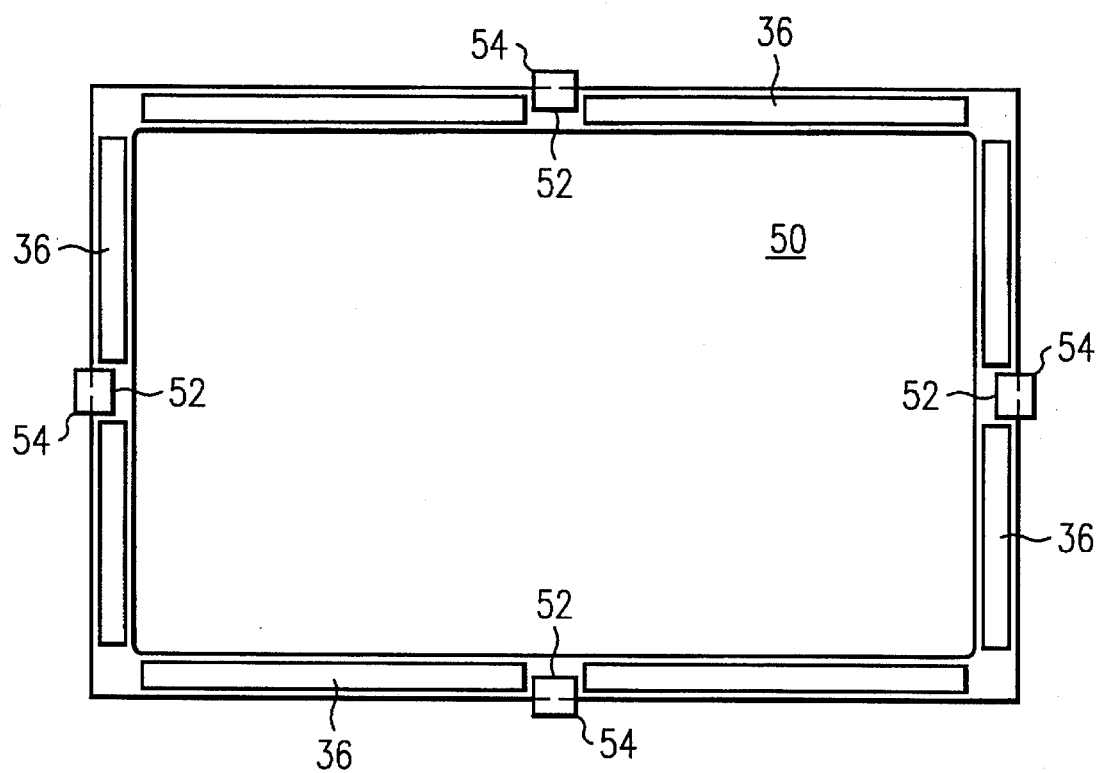

FIGS. 3*a* and 3*b* show a snap-on, conductive rf shield cap 50 for use on the circuit board 12. As seen in FIG. 2(*a*), the cap 50 has four resilient tabs 52 extending past the tongue 36. The tongue 36 provides an rf seal for the joint between the board 12 and the cap 50. The tabs 52 each has an end with an outward-facing hook 54. The shield cap 50 is secured to the circuit board 12 by inserting the tabs 52 through small holes 56 in the component surface 11 of the board 12. The hooks 54 snap onto the opposite surface 21 with a force that exerts 180 pounds of concentrated force, approximately 50,000 pounds per square inch (approx. 3,500 kg. per sq. cm.) between the mating surfaces of the board 12 and the shield cap 50. Because of the improved joint seal provided by this tongue 36 the need for other means to secure and ground this rf shield cap 50 is eliminated.

The embodiments described above are provided to illustrate presently preferred ways of making and using this invention. It will be appreciated by one skilled in the art that variations and modifications of the disclosed apparatus are possible within the spirit and scope of this invention. For example, the rf shield might be mounted on a multi-layer circuit board, or on a grounding material of a chassis rather than a grounding material on a circuit board. The invention is defined by the claims appended below.

I claim:

1. An electronic isolation shield including a sealing edge disposed so as to contact an electronic component assembly when the shield is installed on the electronic component assembly, said sealing edge comprising:

a planar surface disposed along the sealing edge so as to rest against a planar surface on the electronic component assembly: and a longitudinal tongue that extends along the length of the sealing edge and is disposed in relation to said planar surface so as to mate with a grounding material in a surface of a corresponding groove on the electronic component assembly when said planar surface on the sealing edge rests against said planar surface of the electronic component assembly.

2. The electronic isolation shield of claim 1 further comprising:

a tab extending from said planar surface on the sealing edge; and a hook on said tab, said hook and tab being disposed in relation to said planar surface on the sealing edge so as to pass through the surface of the electronic component assembly and dispose said hook against an opposing surface of said electronic component assembly so as to firmly press said tongue of said isolation shield into said groove of said electronic component, whereby the isolation shield is grounded and secured to the electronic component assembly.

3. An electronic component assembly comprising:

a planar surface on the electronic component assembly;

a groove in the electronic component assembly;

a grounding material on the surface of said groove; and an electronic isolation shield, said electronic isolation shield having a sealing edge disposed so as to contact said electronic component assembly when the isolation shield is installed on said electronic component assembly, said isolation shield having a planar surface disposed along its sealing edge so as to rest against said planar surface of the electronic assembly and a longitudinal tongue that extends along the length of its sealing edge and is disposed in relation to said planar surface of said isolation shield so as to mate with said grounding material on the surface of said groove in the electronic component assembly when said planar surface of said isolation shield on its sealing edge rests against said planar surface of said electronic component assembly.

4. The electronic component assembly of claim 3 further comprising:

a tab extending from said planar surface on the sealing edge; and a hook on said tab, said hook and tab being disposed in relation to said planar surface on said sealing edge so as to pass through the surface of the electronic component assembly and dispose said hook against an opposing surface of said electronic component assembly so as to firmly press said tongue of said isolation shield into said groove of said electronic component, whereby the isolation shield is grounded and secured to said electronic component assembly.

\* \* \* \* \*